US009704492B2

(12) United States Patent
Oh et al.

(10) Patent No.: US 9,704,492 B2
(45) Date of Patent: *Jul. 11, 2017

(54) ERROR CONCEALMENT METHOD AND APPARATUS FOR AUDIO SIGNAL AND DECODING METHOD AND APPARATUS FOR AUDIO SIGNAL USING THE SAME

(71) Applicant: Samsung Electronics Co., Ltd., Suwon-si (KR)

(72) Inventors: Eun-mi Oh, Yongin-si (KR); Ki-hyun Choo, Yongin-si (KR); Ho-sang Sung, Yongin-si (KR); Chang-yong Son, Yongin-si (KR); Jung-hoe Kim, Yongin-si (KR); Kang-eun Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 222 days.

This patent is subject to a terminal disclaimer.

(21) Appl. No.: 14/589,617

(22) Filed: Jan. 5, 2015

(65) Prior Publication Data

US 2015/0120309 A1 Apr. 30, 2015

Related U.S. Application Data

(63) Continuation of application No. 13/933,247, filed on Jul. 2, 2013, now Pat. No. 9,373,331, which is a (Continued)

(30) Foreign Application Priority Data

Nov. 24, 2006 (KR) .................. 10-2006-0117252
Dec. 15, 2006 (KR) .................. 10-2006-0128945

(51) Int. Cl.
 G10L 19/00 (2013.01)
 G10L 19/005 (2013.01)
 H03M 13/00 (2006.01)

(52) U.S. Cl.
 CPC .......... *G10L 19/005* (2013.01); *H03M 13/00* (2013.01)

(58) Field of Classification Search
 CPC ..... G10L 19/005; G10L 25/78; H03M 13/373
 (Continued)

(56) References Cited

U.S. PATENT DOCUMENTS 5,353,059 A 10/1994 Lawlor et al.
5,673,363 A 9/1997 Jeon et al.
(Continued)

FOREIGN PATENT DOCUMENTS

JP 09282810 10/1997

OTHER PUBLICATIONS

US Office Action issued Sep. 30, 2015 in U.S. Appl. No. 13/933,247.
(Continued)

*Primary Examiner* — Daniel Abebe
(74) *Attorney, Agent, or Firm* — Staas & Halsey LLP

(57) ABSTRACT

An error concealment method and apparatus for an audio signal and a decoding method and apparatus for an audio signal using the error concealment method and apparatus. The error concealment method includes selecting one of an error concealment in a frequency domain and an error concealment in a time domain as an error concealment scheme for a current frame based on a predetermined criteria when an error occurs in the current frame, selecting one of a repetition scheme and an interpolation scheme in the frequency domain as the error concealment scheme for the current frame based on a predetermined criteria when the (Continued)

error concealment in the frequency domain is selected, and concealing the error of the current frame using the selected scheme.

10 Claims, 12 Drawing Sheets

Related U.S. Application Data continuation of application No. 13/544,203, filed on Jul. 9, 2012, now Pat. No. 8,676,569, which is a continuation of application No. 11/930,752, filed on Oct. 31, 2007, now Pat. No. 8,219,393.

(58) Field of Classification Search
USPC .......................................................... 704/500
See application file for complete search history.

(56) References Cited

U.S. PATENT DOCUMENTS

| | | | |
|---|---|---|---|
| 5,745,169 | A | 4/1998 | Murphy et al. |
| 6,597,961 | B1 | 7/2003 | Cooke |
| 7,529,673 | B2 * | 5/2009 | Makinen ............... G10L 19/005 704/200 |
| 8,200,481 | B2 | 6/2012 | Xu et al. |
| 8,219,393 | B2 | 7/2012 | Oh |
| 8,255,207 | B2 * | 8/2012 | Vaillancourt ......... G10L 19/005 375/240.27 |
| 8,423,358 | B2 | 4/2013 | Kapilow |
| 8,676,569 | B2 | 3/2014 | Oh |
| 2002/0147590 | A1 | 10/2002 | Sydanmaa et al. |
| 2003/0115043 | A1 | 6/2003 | Wiese et al. |
| 2004/0039464 | A1 | 2/2004 | Virolainen et al. |
| 2004/0083110 | A1 * | 4/2004 | Wang .................... G10L 19/005 704/500 |
| 2005/0044471 | A1 | 2/2005 | Chia et al. |
| 2006/0093048 | A9 | 5/2006 | Taleb |
| 2006/0262864 | A1 | 11/2006 | Shi et al. |
| 2007/0239462 | A1 * | 10/2007 | Makinen ............... G10L 19/005 704/500 |

OTHER PUBLICATIONS

US Notice of Allowance dated Feb. 18, 2016 in U.S. Appl. No. 13/933,247.
US Supplemental Notice of Allowance dated Feb. 25, 2016 in U.S. Appl. No. 13/933,247.
Faller C et al.: "Technical advances in digital audio radio broadcasting", Proceedings of the IEEE, IEEE, New 1 York, US, vol. 90, No. 8, Aug. 1, 2002 (Aug. 1, 2002), pp. 1303-1333, XP011065048,1SSN:0018-9219, DOI: DOI:10.1109/JPROC.2002.800718.
Search Report issued on Feb. 22, 2011 of the European Application No. 07833938.9.
US Notice of Allowance dated Mar. 12, 2012 issued in U.S. Appl. No. 11/930,752.
US Office Action dated Dec. 27, 2011 issued in U.S. Appl. No. 11/930,752.
US Office Action dated Jun. 27, 2011 issued in U.S. Appl. No. 11/930,752.
US Office Action dated Jan. 10, 2011 issued in U.S. Appl. No. 11/930,752.
US Notice of Allowance dated Oct. 25, 2013 issued in U.S. Appl. No. 13/544,203.
US Notice of Allowance dated Jul. 16, 2013 issued in U.S. Appl. No. 13/544,203.
US Office Action dated May 2, 2013 issued in U.S. Appl. No. 13/544,203.
US Office Action dated Aug. 28, 2012 issued in U.S. Appl. No. 13/544,203.
US Notice of Allowance dated Aug. 27, 2014 issued in U.S. Appl. No. 13/933,247.
US Office Action dated Apr. 3, 2014 issued in U.S. Appl. No. 13/933,247.
US Office Action dated Dec. 18, 2013 issued in U.S. Appl. No. 13/933,247.
U.S. Appl. No. 13/933,247, filed Jul. 2, 2013, Eum-mi Oh, et al. Samsung Electronics Co., Ltd.
US Office Action issued Feb. 18, 2015 in U.S. Appl. No. 13/933,247.

* cited by examiner

FIG. 2

| ERROR OCCURRENCE CONDITION | | | WINDOW TYPE | | ERROR CONCEALMENT SCHEME |
|---|---|---|---|---|---|
| Prev. | Curr. | Next. | Prev. | Next. | |
| G | E | G | L | L | CONCEAL ERROR OF CURRENT FRAME ACCORDING TO INTERPOLATION SCHEME USING PGF AND NGF |
| G | E | G | L | S | CONCEAL ERROR OF CURRENT FRAME ACCORDING TO REPETITION SCHEME USING PGF |
| G | E | G | S | L | CONCEAL ERROR OF CURRENT FRAME ACCORDING TO REPETITION SCHEME USING NGF |
| G | E | G | S | S | CONCEAL ERROR OF CURRENT FRAME IN TIME DOMAIN |
| G | E | E | L | · | CONCEAL ERROR OF CURRENT FRAME ACCORDING TO REPETITION SCHEME USING NGF |
| G | E | E | S | · | CONCEAL ERROR OF CURRENT FRAME IN TIME DOMAIN |
| E | E | G | · | L | CONCEAL ERROR OF CURRENT FRAME ACCORDING TO REPETITION SCHEME USING NGF |
| E | E | G | · | S | CONCEAL ERROR OF CURRENT FRAME IN TIME DOMAIN |
| E | E | E | · | · | CONCEAL ERROR OF CURRENT FRAME USING SAME SCHEME AS USED TO CONCEAL ERROR OF PREVIOUS FRAME |

ERROR CONCEALMENT METHOD AND APPARATUS FOR AUDIO SIGNAL AND DECODING METHOD AND APPARATUS FOR AUDIO SIGNAL USING THE SAME

CROSS-REFERENCE TO RELATED APPLICATIONS

This application is a continuation application of prior application Ser. No. 13/933,247, filed on Jul. 2, 2013, which is a continuation application of Ser. No. 13/544,203, filed on Jul. 9, 2012, now U.S. Pat. No. 8,676,569, which is a continuation application of Ser. No. 11/930,752, filed on Oct. 31, 2007, now U.S. Pat. No. 8,219,393, in the United States Patent and Trademark Office, which claims priority under 35 U.S.C. §119(a) from Korean Patent Application Nos. 10-2006-0117252 filed on Nov. 24, 2006, and 10-2006-0128945 filed on Dec. 15, 2006, in the Korean Intellectual Property Office, the disclosures of which are incorporated herein in their entirety by reference.

BACKGROUND OF THE INVENTION

1. Field of the Invention

The present general inventive concept relates to a method of and apparatus to conceal an error of an audio signal, and more particularly, to an error concealment method and apparatus for an audio signal, in which modulation noise can be prevented from being generated when an error occurring over a long interval is concealed by a repetition scheme in a frequency domain.

2. Description of the Related Art

An error may occur during transmission of an encoded audio signal over a wired or wireless network such as a terrestrial digital multimedia broadcasting (T-DMB) network or an Internet protocol (IP) network. Without proper processing of the error, annoying distortion would occur due to a transmission error, resulting in degradation of sound quality.

Conventionally, in order to conceal the error of an audio signal, a repetition scheme that reconstructs an error frame by repeating the spectrum of a previous good frame or an interpolation scheme that reconstructs an error frame by interpolating the spectrum of a previous good frame and the spectrum of a next good frame were used.

However, when the error occurs over a long interval, the same spectrum of the previous good frame is repeated over the long interval, causing modulation noise.

SUMMARY OF THE INVENTION

The present general inventive concept provides an error concealment method and apparatus for an audio signal, in which a repetition scheme and an interpolation scheme in a frequency domain are selectively utilized to conceal an error that occurs in a frame and an error concealment in a time domain is used when it is difficult or impossible to conceal the error in the frequency domain, thereby preventing sound quality from degrading due to modulation noise.

The present general inventive concept also provides a decoding method and apparatus for an audio signal, in which sound quality can be prevented from degrading due to modulation noise by reconstructing an error frame using the error concealment method and apparatus, thereby improving perceptual sound quality.

The present general inventive concept also provides a computer-readable medium having recorded thereon a program to implement one of the error concealment method and the decoding method.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing an error concealment method for an audio signal. The error concealment method includes when an error occurs in a current frame, selecting one of an error concealment in a frequency domain and an error concealment in a time domain as an error concealment scheme for the current frame based on a predetermined criteria, when the error concealment in the frequency domain is selected, selecting one of a repetition scheme and an interpolation scheme in the frequency domain as the error concealment scheme for the current frame based on a predetermined criteria, and concealing the error of the current frame using the selected scheme.

The selecting one of the error concealment operation may include selecting one of the error concealment in the frequency domain and the error concealment in the time domain as the error concealment scheme for the current frame based on a least one of error occurrence conditions and window types of a previous frame preceding the current frame and a next frame following the current frame.

The selecting one of the error concealment operation may include, when at least one of the previous frame and the next frame is a good frame, selecting one of the error concealment in the frequency domain and the error concealment in the time domain as the error concealment scheme for the current frame based on the window type of the good frame.

The selecting one of the error concealment operation may include, when both a previous frame preceding the current frame and a next frame following the current frame are good frames, selecting one of the error concealment in the frequency domain and the error concealment in the time domain as the error concealment scheme for the current frame based on an error concealment scheme used to conceal an error occurring in the previous frame.

The selecting one of the error concealment operation may include selecting one of the error concealment in the frequency domain and the error concealment in the time domain as the error concealment scheme for the current frame based on the length of a frame interval including the error.

The concealing operation may include, when the interpolation scheme is selected in the selecting one of the repetition scheme operation, concealing the error of the current frame according to the interpolation scheme using an amplitude of the spectrum of one of a previous good frame and a next good frame and a sign of the spectrum of the other frame.

The concealing operation may include, when the interpolation scheme is selected in the selecting one of the repetition scheme operation, concealing the error of the current frame according to the interpolation scheme for every scale factor band using the amplitude of the spectrum of a scale factor band of one of a previous good frame and a next good frame and a sign of the spectrum of the other scale factor band.

The concealing operation may include, when the interpolation scheme is selected in the selecting one of the repetition scheme operation, concealing the error of the current frame according to the interpolation scheme for every frequency bin using the amplitude of one of the spectrums of a previous good frame and a next good frame and a sign of the other spectrum.

The concealing operation may include, when the interpolation scheme is selected in the selecting one of the repetition scheme operation, concealing the error of the current frame according to the interpolation scheme using the spectrum of one of a previous good frame and a next good frame, which is selected based on the energies of the previous good frame and the next good frame.

The concealing operation may include, when the interpolation scheme is selected in the selecting one of the repetition scheme operation, concealing the error of the current frame according to the interpolation scheme for every scale factor band using the spectrum of a scale factor band of one of a previous good frame and a next good frame, which is selected based on the energies of the scale factor bands of the previous good frame and the next good frame.

The concealing operation may include, when the repetition scheme is selected in the selecting one of the repetition scheme operation, concealing the error of the current frame according to the repetition scheme using the spectrum of a good frame having a window type that is a long window, which is selected from among a previous frame preceding the current frame and a next frame following the current frame.

The concealing operation may include, when the error concealment in the time domain is selected in the selecting one of the error concealment operation, if at least one of a previous frame preceding the current frame and a next frame following the current frame is a good frame, concealing the error of the current frame according to the error concealment in the time domain using the at least one good frame.

The error concealment method may further include applying fade-in and fade-out operations to an audio signal of the current frame that has been error-concealed in the frequency domain or in the time domain.

The error concealment method may further include determining whether the error occurs in the current frame.

The foregoing and/or other aspects and utilities of the present general inventive concept may also be achieved by providing an error concealment apparatus for an audio signal. The error concealment apparatus includes a first selection unit, a second selection unit, and an error concealment unit. When an error occurs in a current frame, the first selection unit selects one of an error concealment in a frequency domain and an error concealment in a time domain as an error concealment scheme for the current frame based on a predetermined criteria. When the error concealment in the frequency domain is selected, the second selection unit selects one of a repetition scheme and an interpolation scheme in the frequency domain as the error concealment scheme for the current frame based on predetermined criteria. The error concealment unit conceals the error of the current frame using the selected scheme.

The foregoing and/or other aspects and utilities of the present general inventive concept may also be achieved by providing a decoding method for an audio signal. The decoding method includes determining whether an error occurs in a current frame, decoding the current frame when the error does not occur in the current frame, selecting one of an error concealment in a frequency domain and an error concealment in a time domain as an error concealment scheme for the current frame based on a predetermined criteria when the error occurs in the current frame, selecting one of a repetition scheme and an interpolation scheme in the frequency domain as the error concealment scheme for the current frame based on a predetermined criteria when the error concealment in the frequency domain is selected, and concealing the error of the current frame using the selected scheme.

The foregoing and/or other aspects and utilities of the present general inventive concept may also be achieved by providing a decoding apparatus for an audio signal. The decoding apparatus includes an error detection unit that determines whether an error occurs in a current frame, a decoding unit that decodes the current frame when the error does not occur in the current frame, a first selection unit that selects one of an error concealment in a frequency domain and an error concealment in a time domain as an error concealment scheme for the current frame based a on predetermined criteria when the error occurs in the current frame, a second selection unit that selects one of a repetition scheme and an interpolation scheme in the frequency domain as the error concealment scheme for the current frame based on a predetermined criteria when the error concealment in the frequency domain is selected, and an error concealment unit that conceals the error of the current frame using the selected scheme.

The foregoing and/or other aspects and utilities of the present general inventive concept may also be achieved by providing a computer-readable medium having recorded thereon a program to implement one of the error concealment method and the decoding method.

The foregoing and/or other aspects and utilities of the present general inventive concept may also be achieved by providing an error concealment method for an audio signal transmitted by a plurality of frames, the method including determining whether an error occurs in one of the plurality of frames and, if so, selecting one of an error concealment scheme in a frequency domain and an error concealment scheme in a time domain for the one frame based on predetermined criteria, and concealing the error of the one frame using the selected error concealment scheme.

The foregoing and/or other aspects and utilities of the present general inventive concept may also be achieved by providing a method to reconstruct an audio signal, the method including detecting whether an error in a current frame exists, reconstructing the audio signal of the current frame by performing an inverse modulated discrete cosine transformation (MDCT) on a spectrum of the current frame, when the detecting operation detects that the error in the current frame does not exist, identifying whether a position of the error is before a threshold position when the detecting operation detects that the error in the current frame exists, reconstructing the audio signal of the current frame by performing inverse MDCT on the spectrum of the current frame when the identifying operation identifies that the position of the error is not before the threshold position, determining whether the error can be concealed in a frequency domain, when the identifying operation identifies that the position of the error is before the threshold position, and reconstructing the audio signal of the current frame by concealing the error in a time domain, when the determining operation determines that the error can not be concealed in the frequency domain.

The foregoing and/or other aspects and utilities of the present general inventive concept may also be achieved by providing an audio processing system including an encoder having an error concealing apparatus to select one of an error concealment in a frequency domain and an error concealment in a time domain as an error concealment scheme for the current frame based on a predetermined criteria when an error occurs in a current frame, to select one of a repetition scheme and an interpolation scheme in the frequency domain as the error concealment scheme for the current frame based on a predetermined criteria when the error concealment in the frequency domain is selected, and to conceal the error of the current frame using the selected scheme to generate an encoded audio signal and a decoder to decode the encoded audio signal according to information on the selected one of the error concealment in the frequency domain and the error concealment in the time domain.

The foregoing and/or other aspects and utilities of the present general inventive concept may also be achieved by providing a method of operating an audio processing system, the method including selecting one of an error concealment in a frequency domain and an error concealment in a time domain as an error concealment scheme for the current frame based on a predetermined criteria when an error occurs in a current frame, selecting one of a repetition scheme and an interpolation scheme in the frequency domain as the error concealment scheme for the current frame based on a predetermined criteria when the error concealment in the frequency domain is selected, and concealing the error of the current frame using the selected scheme to generate an encoded audio signal, and decoding the encoded audio signal according to information on the selected one of the error concealment in the frequency domain and the error concealment in the time domain.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which:

FIG. 2 illustrates a table illustrating error concealment schemes for a current frame according to error occurrence conditions and window types of a previous frame and a next frame according to an embodiment of the general inventive concept;

DETAILED DESCRIPTION OF THE PREFERRED EMBODIMENTS

Figure 1A:
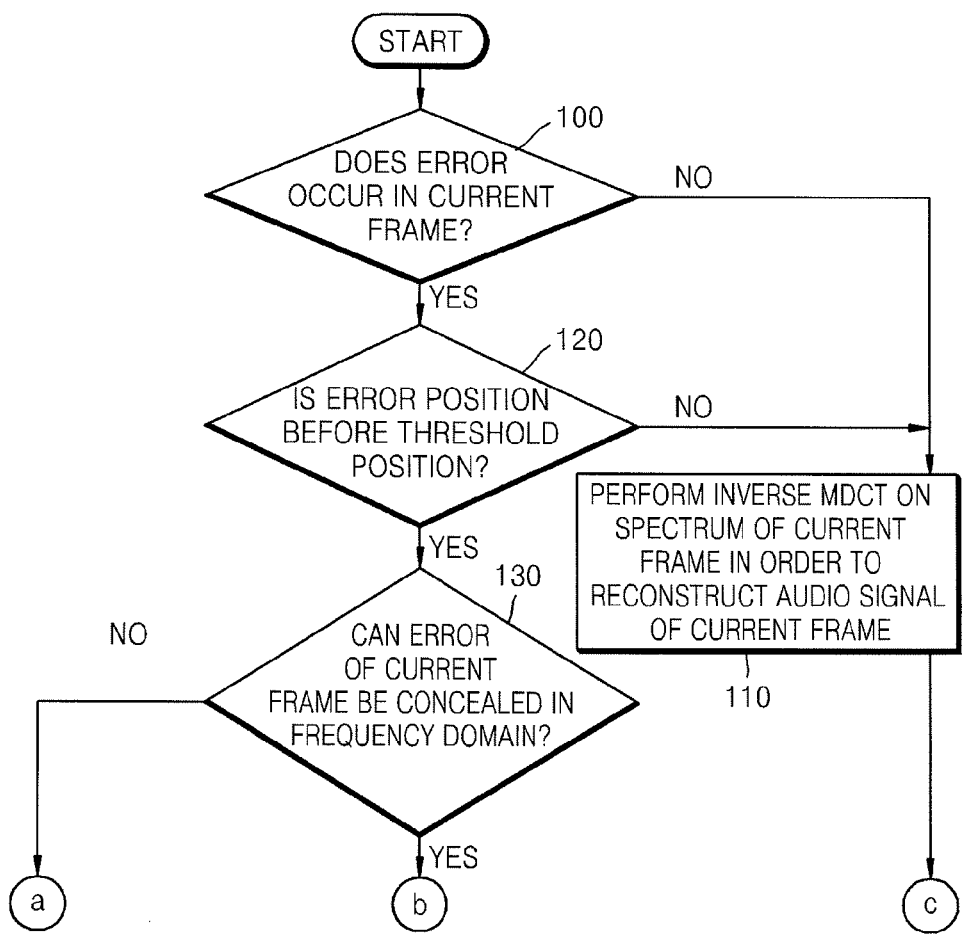
FIGS. 1A and 1B are flowcharts illustrating a decoding method for an audio signal, which uses an error concealment method for an audio signal according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 1B:
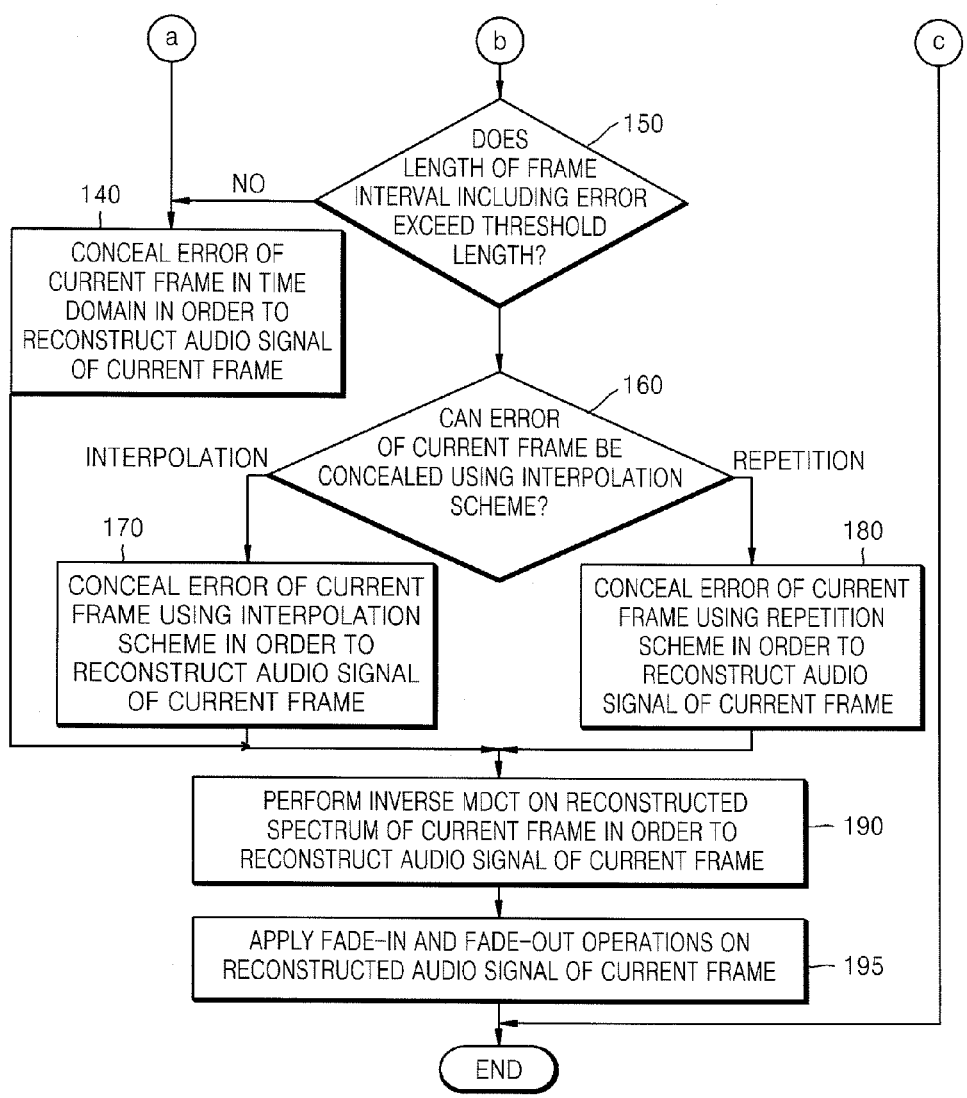

FIGS. 1A and 1B are flowcharts illustrating a decoding method for an audio signal, which uses an error concealment method for an audio signal according to an exemplary embodiment of the present general inventive concept.

Whether an error occurs in the current frame is checked in operation 100. If an error does not occur in the current frame, i.e., the current frame is a good frame, an inverse MDCT (modulated discrete cosine transformation) is performed on spectrum coefficients of the current frame, thereby reconstructing an audio signal of the current frame in operation 110.

If an error occurs in the current frame, it is checked if an error position at which the error occurs is before or after a predetermined threshold position in operation 120. If the error position is after the threshold position, the process goes to operation 110 to normally decode the current frame. When a bitstream is composed of a plurality of layers like a bitstream encoded using bit sliced arithmetic coding (BSAC), layers preceding the error position can be decoded normally. Thus, when an error occurs in the last layer, which hardly has an influence upon the sound quality of the audio signal, layers preceding the last layer where the error occurs are reconstructed normally and spectrum information of the last layer can be reconstructed from spectrum information of the reconstructed layers. Thus, in spite of the determination that the error occurs in the current frame in operation 100, when the error position is after the threshold position, and thus the error hardly has an influence upon the sound quality of the audio signal, the error of the current frame is not concealed and the current frame is decoded normally, instead of reconstructing the current frame having the error using error concealment, thereby making the most of information in layers where the error does not exist. A decoding result for a good frame that is normally decoded in operation 110 may be stored to be used in error concealment for a next frame.

If it is determined that the error position is before the threshold position in operation 120, another determination is made as to whether the error of the current frame can be concealed in a frequency domain, i.e., whether the error concealment in the frequency domain is applicable to conceal the error of the current frame, based on error occurrence conditions and window types of a previous frame preceding the current frame and a next frame following the current frame in operation 130. Detailed criteria for the determination in operation 130 will be described below.

When it is determined that the error of the current frame cannot be concealed in the frequency domain in operation 130, the error of the current frame is concealed in a time domain in operation 140. When it is determined that the error of the current frame can be concealed in the frequency domain in operation 130, it is determined whether to conceal the error in the frequency domain or in the time domain based on a length of a frame interval including the error in operation 150. More specifically, when the length of the frame interval including the error exceeds a predetermined threshold length, it is determined to conceal the error in the time domain. When the length of the frame interval including the error is less than the threshold length, it is determined to conceal the error in the frequency domain. This is because, although an error occurring over a long interval is concealed using an interpolation scheme, the length of an error-concealed interval during which the error is concealed increases due to the repetition scheme and thus the same spectrum is repeated over the long interval, causing modulation noise. Accordingly, when the error occurs over a long interval, error concealment in the time domain is performed even if error concealment in the frequency domain is available, thereby minimizing modulation noise and sound quality degradation.

When it is determined to conceal the error in the time domain in operation 150, the process goes to operation 140 to conceal the error of the current frame in the time domain. In error concealment in the time domain, the audio signal of the current frame is reconstructed using an audio signal in a time domain of a previous good frame (PGF) and/or an audio signal in a time domain of a next good frame (NGF). When it is determined to conceal the error in the frequency domain in operation 150, it is determined whether to use the repetition scheme in the frequency domain or the interpolation scheme in the frequency domain to conceal the error of the current frame based on error occurrence conditions and window types of the previous frame and the next frame in operation 160. As mentioned above, when the length of the error-concealed interval using the repetition scheme increases, modulation noise may be generated. Thus, it may be desirable to use the interpolation scheme when the interpolation scheme is applicable and use the repetition scheme only when the interpolation scheme is not applicable based on error occurrence conditions and window types of the previous frame and the next frame. Criteria for the determination of whether the interpolation scheme is applicable in operation 160 will be described below.

When it is determined that the interpolation scheme is applicable to conceal the error of the current frame in operation 160, the error of the current frame is concealed using the interpolation scheme and the spectrum of the previous frame and the spectrum of the next frame in operation 170. When it is determined that the interpolation scheme is not applicable in operation 160, the error of the current frame is concealed using the repetition scheme in operation 180. The spectrum of the current frame is reconstructed using the spectrum of the PGF and the spectrum of the NGF in the interpolation scheme and using the spectrum of one of the PGF and the NGF in the repetition scheme.

In operation 190, an inverse MDCT is performed on the spectrum of the current frame, which has been reconstructed in operation 170 or operation 180, thereby reconstructing the audio signal of the current frame. In operation 195, fade-in and fade-out post-processing operations in the time domain are performed on the audio signal of the current frame, which has been reconstructed in operation 140 or operation 190, to allow the reconstructed audio signal to be heard naturally.

Hereinafter, the criteria for the determination of whether error concealment in the frequency domain is applicable in operation 130 and the criteria for the determination of whether the interpolation scheme in the frequency domain is applicable in operation 160 will be described in detail. According to an embodiment of the present general inventive concept, one of error concealment in the frequency domain and error concealment in the time domain is selected to conceal the error of the current frame based on the error occurrence conditions and window types of the previous frame and the next frame in operation 130, and one of the repetition scheme and the interpolation scheme in the frequency domain is selected to conceal the error of the current frame based on the error occurrence conditions and window types of the previous frame and the next frame in operation 160.

Accordingly, the error occurrence condition of a frame indicates whether or not an error occurs in the frame. Thus, a frame where an error occurs is marked with E (error) and a frame where an error does not occur is marked with G (good). The window type of a frame indicates whether the window of the frame is a long window or a short window. Thus, a frame having a long window is marked with L (long) and a frame having a short window is marked with S (short). Although the window type may further include a long stop window that is inserted when a change from the long window to the short window exists and a long start window that is inserted when a change from the short window to the long window exists, the other windows except for the long window will be referred to as short windows for convenience of explanation. In general, the long window is used for modulated discrete cosine transformation (MDCT) with respect to a stationary signal that hardly changes during a long interval and is stable, and the short window is used for MDCT with respect to a transient signal that sharply changes or includes a sudden attack signal.

The following principles are used as the criteria for the determination of an error concealment scheme for the current frame in operation 130 and operation 160.

In order to apply error concealment in the frequency domain to the error of the current frame, at least one of the previous frame and the next frame has to be a good frame. This is because the interpolation scheme reconstructs the spectrum of the current frame by interpolating the spectrum of the PGF and the spectrum of the NGF and the repetition scheme reconstructs the spectrum of the current frame by copying the spectrum of one of the PGF and the NGF.

The window type of a good frame used in error concealment in the frequency domain has to be a long window. This is because, in the interpolation scheme, when the window type of the PGF and the window type of the NGF are different from each other, spectrum coefficients in the frequency domain cannot be interpolated, due to the nature of MDCT. Also in the repetition scheme, when the window type of a good frame to be copied to the current frame is not a long window, the audio signal of the current frame, which is reconstructed by copying the spectrum of the good frame to the current frame, may cause unexpected noise. For example, for the PGF undergoing MDCT using 8 short windows, when the spectrum of the current frame is reconstructed by repeating spectrum data corresponding to the last window of the PGF 8 times and the last window includes an attack signal or a noise signal, the attack signal or the noise signal may be repetitively output from the current frame. Moreover, since the spectrum data corresponding to the last window is repeated 8 times, modulation noise may be generated.

When the previous frame is an error frame and the error of the previous frame is concealed in the time domain, the spectrum of the previous frame is not supposed to be reconstructed. Accordingly, since the reconstructed spectrum of the previous frame cannot be used to conceal the error of the current frame, the current frame may be reconstructed using a next frame when the next frame is a good frame, or the error of the current frame may be concealed in the time domain using a reconstructed time domain signal of the previous frame. Thus, the repetition scheme that uses the spectrum of the previous frame cannot be used to conceal the error of the current frame.

Hereinafter, error concealment schemes to conceal the error of the current frame, which are determined based on the error occurrence conditions and window types of the previous frame and the next frame, according to an exemplary embodiment of the present general inventive concept will be described with reference to FIG. 2. FIG. 2 illustrates a table illustrating error concealment schemes for the current frame according to the error occurrence conditions and window types of the previous frame and the next frame.

For example, where both the previous frame and the next frame are good frames will be considered. When the window types of the PGF and the NGF are long widows, the interpolation scheme in the frequency domain can be applied and thus the error of the current frame is concealed using the interpolation scheme. When the window type of only one of the PGF and the NGF is a long window, the error of the current frame is concealed by repeating the spectrum of a frame that is MDCT-transformed using a long window in the current frame. When the window type of neither the PGF nor the NGF is a long window, the error of the current frame is concealed using error concealment in the time domain. Accordingly, error concealment in the frequency domain, such as the interpolation scheme or the repetition scheme, cannot be used as discussed above. Instead, it may be desirable to reconstruct a time-domain signal of the current frame using both a time-domain signal of the PGF and a time-domain signal of the NGF.

Alternatively, where only one of the previous frame and the next frame is a good frame and the other is an error frame will be considered. Also, whether or not the window type of the good frame is a long window will be considered. When the window type of the PGF or the NGF is a long window, the error of the current frame is concealed according to the repetition scheme using the good frame having the long window. Accordingly, when the previous frame is an error frame and the window type of the NGF is a long window, the error of the current frame may be concealed according to the repetition scheme using the NGF. However, if the error of the previous frame has not been concealed in the time domain, i.e., the error of the previous frame has been concealed using the repetition scheme, the spectrum of the current frame may be reconstructed by interpolating the reconstructed spectrum of the previous frame and the spectrum of the NGF, thereby concealing the error of the current frame. When the window type of the PGF or the NGF is not a long window, the repetition scheme cannot be used and thus the error of the current frame is concealed using error concealment in the time domain. Accordingly, an error concealment scheme for the current frame is determined in a similar manner as to where the window type of only one of the PGF and the NGF is a long window or where the window type of neither the PGF nor the NGF is a long window.

Accordingly, where both the previous frame and the next frame are error frames will be considered. An error concealment scheme that can be applied to the error of the current frame is determined according to an error concealment scheme used to conceal the error of the previous frame. Where the error of the previous frame is concealed using the repetition scheme in the frequency domain will be discussed. Since the current frame is an error frame, the interpolation scheme may not be used in the previous frame. When the error of the previous frame is concealed using the repetition scheme, the error of the current frame may also be concealed by repeating a spectrum that has been repeated for the previous frame. However, when modulation noise is likely to be generated because a frame error has been concealed using the repetition scheme more than a consecutive number of times, the error concealment scheme may be changed to conceal the frame error using the time domain. Alternatively, where the error of the previous frame is concealed in the time domain will be discussed. Since the error of the previous frame is concealed in the time domain, there is no reconstructed spectrum of the previous frame. Accordingly, the spectrum of the previous frame cannot be used to conceal the error of the current frame using the repetition scheme. Thus, when the error of the previous frame is concealed using error concealment in the time domain, the error of the current frame may also be concealed using error concealment in the time domain.

Thus, in operation 130 (FIG. 1A), whether error concealment in the frequency domain, i.e., the repetition scheme or the interpolation scheme, is applicable to conceal the error of the current frame can be determined as follows: it is determined that error concealment in the frequency domain can be applied to conceal the error of the current frame (1) where at least one of the previous frame and the next frame is a good frame and at least one of the window types of good frames is a long window or (2) where neither the previous frame nor the next frame are good frames, i.e., both the previous frame and the next frame are error frames, and error concealment in the frequency domain, i.e., the repetition scheme, is applied to conceal the error of the previous frame, and otherwise, it is determined that error concealment in the frequency domain cannot be applied and thus the error of the current frame is concealed using error concealment in the time domain.

Also, in operation 160 (FIG. 1B), whether to use the interpolation scheme in the frequency domain or the repetition scheme in the frequency domain to conceal the error of the current frame can be determined as follows: it is determined to use the interpolation scheme to conceal the error of the frame (1) where both the previous frame and the next frame are good frames and the window types of both the previous frame and the next frame are long windows or (2) where the error of the previous frame has been concealed using the repetition scheme, the next frame is a good frame, and the window type of the next frame is a long window, and it is determined to use the repetition scheme to conceal the error of the current frame such as (3) where both the previous frame and the next frame are good frames, but the window type of only one of the previous frame and the next frame is a long window, (4) where only one of the previous frame and the next frame is a good frame and the window type of the good frame is a long window, or (5) where both the previous frame and the next frame are error frames and the error of the previous frame is concealed using the repetition scheme.

As discussed above, however, when the previous frame is an error frame, the next frame is a good frame, and the window type of the next frame is a long window, if the error of the previous frame has been concealed using the repetition scheme, the error of the current frame can be concealed by interpolating the reconstructed spectrum of the previous frame and the spectrum of the next good frame or by repeating the spectrum of the next good frame. Thus, one of the interpolation scheme and the repetition scheme may be determined as an error concealment scheme for the current frame.

Thus, according to an embodiment of the present general inventive concept, the optimal error concealment scheme for the current frame can be selected from among the repetition scheme and the interpolation scheme in the frequency domain and error concealment in the time domain based on the error occurrence conditions and window types of the previous frame and the next frame and the error of the current frame can be concealed using the selected scheme, thereby minimizing modulation noise and sound quality degradation in the reconstructed audio signal.

Hereinafter, error concealment using the interpolation scheme in operation 170 according to exemplary embodiments of the present general inventive concept will be described with reference to FIGS. 3A through 8B. FIGS. 3A through 8B are detailed flowcharts illustrating operation 170 (FIG. 1B) according to exemplary embodiments of the present general inventive concept.

Figure 3A:
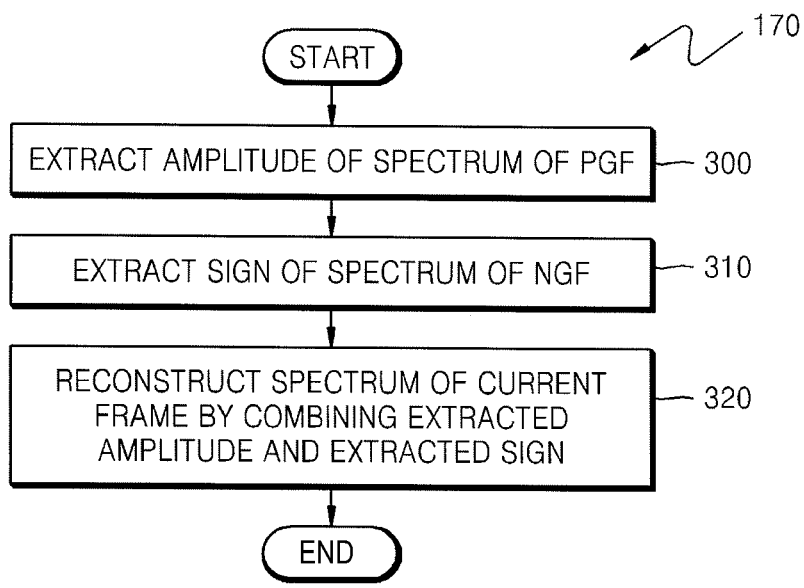
FIGS. 3A through 8B are detailed flowcharts illustrating a spectrum reconstruction operation using an interpolation method illustrated in FIGS. 1A and 1B according to exemplary embodiments of the present general inventive concept.

According to an exemplary embodiment of the present general inventive concept illustrated in FIG. 3A, for every frame, the spectrum of the current frame is generated by combining the amplitude of the spectrum of the PGF and the sign of the spectrum of the NGF, thereby concealing the error of the current frame. Accordingly, the amplitude of the spectrum of the PGF is extracted in operation 300 and the sign of the spectrum of the NGF is extracted in operation 310. The spectrum of the current frame is reconstructed by combining the extracted spectrum data in operation 320.

Figure 3B:
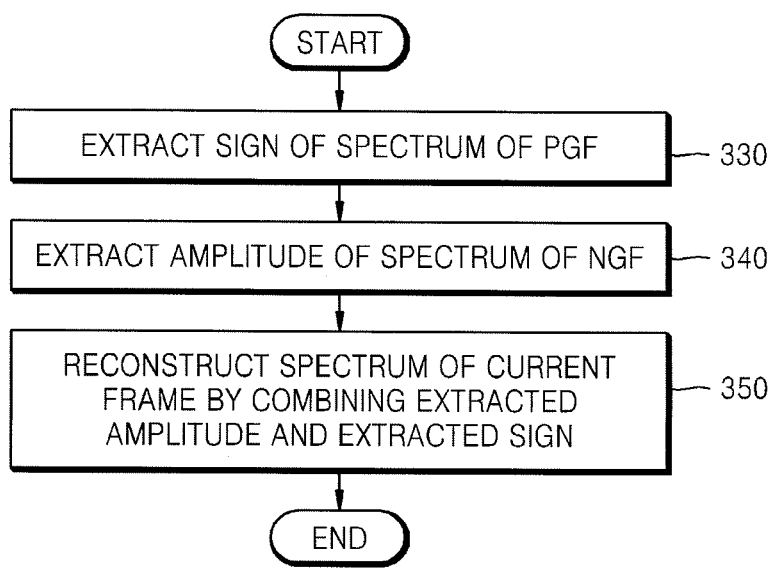

According to an exemplary embodiment of the present general inventive concept illustrated in FIG. 3B, for every frame, the spectrum of the current frame is generated by combining the sign of the spectrum of the PGF and the amplitude of the spectrum of the NGF, thereby concealing the error of the current frame. Accordingly, the sign of the spectrum of the PGF is extracted in operation 330 and the amplitude of the spectrum of the NGF is extracted in operation 340. In operation 350, the spectrum of the current frame is reconstructed by combining the extracted spectrum data.

Figure 4A:
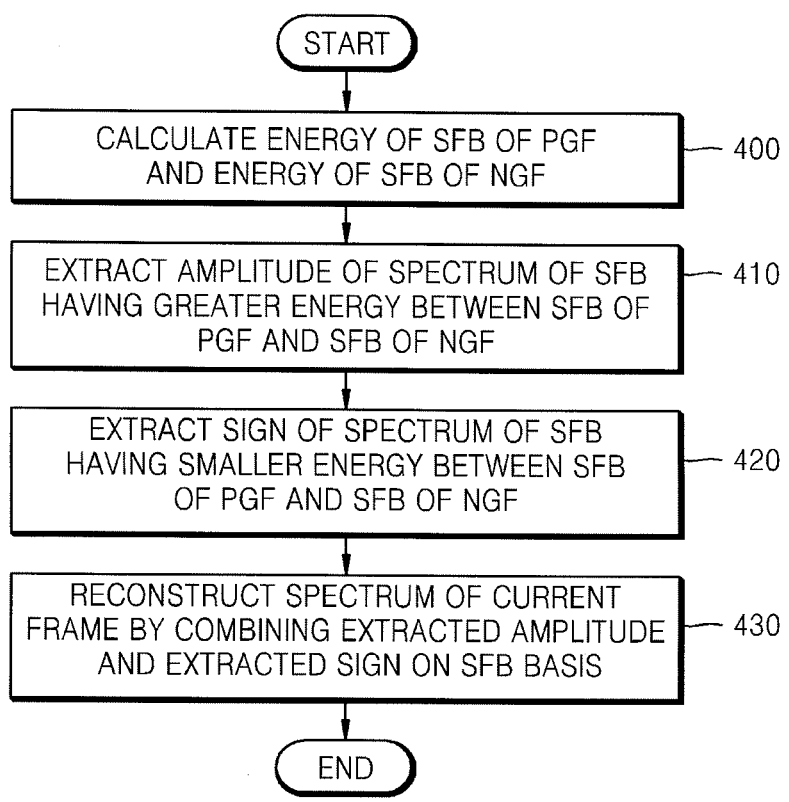

According to an exemplary embodiment of the present general inventive concept illustrated in FIG. 4A, for every scale factor band (SFB), the amplitude of the spectrum of the SFB of one of the PGF and the NGF, which has the greater energy than the SFB of the other, and the sign of the spectrum of the SFB of the other are combined, thereby reconstructing the spectrum of the current frame. More specifically, for every SFB, the energy of the SFB of the PGF and the energy of the SFB of the NGF are calculated in operation 400. The amplitude of the spectrum of the SFB having the greater energy between the energy of the SFB of the PGF and the energy of the SFB of the NGF is extracted in operation 410. The sign of the spectrum of the SFB having the smaller energy is extracted in operation 420. The extracted amplitude of the spectrum and the extracted sign of the other spectrum are combined, thereby reconstructing the spectrum of the current frame in operation 430.

Figure 4B:
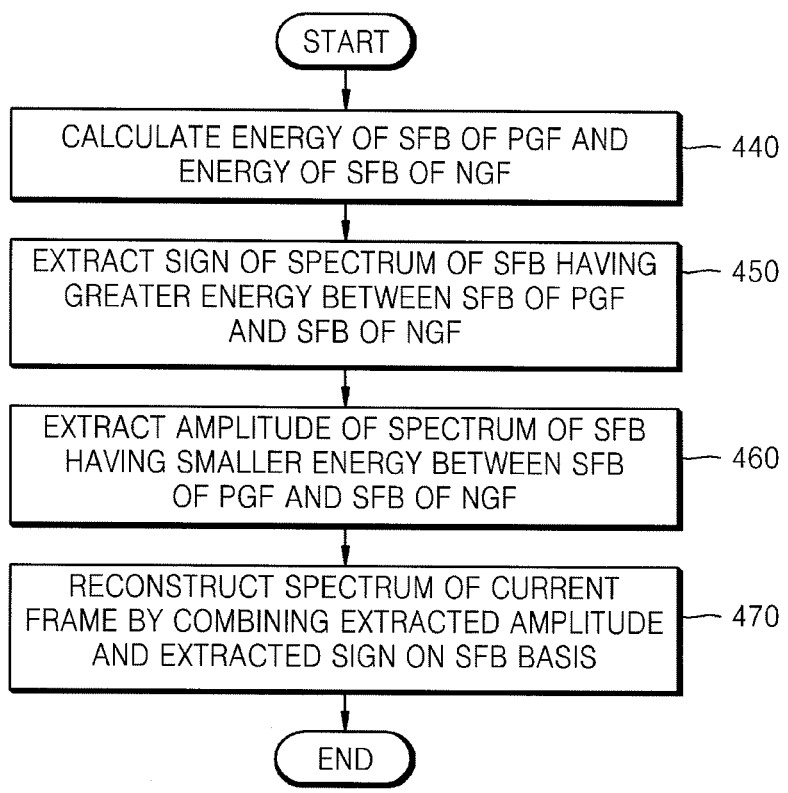

According to an exemplary embodiment of the present general inventive concept illustrated in FIG. 4B, for every SFB, the sign of the spectrum of the SFB of one of the PGF and the NGF, which has the greater energy than the SFB of the other, and the amplitude of the spectrum of the SFB of the other are combined, thereby reconstructing the spectrum of the current frame. More specifically, for every SFB, the energy of the SFB of the PGF and the energy of the SFB of the NGF are calculated in operation 440. The sign of the spectrum of the SFB having the greater energy between the energy of the SFB of the PGF and the energy of the SFB of the NGF is extracted in operation 450. The amplitude of the spectrum of the SFB having the smaller energy is extracted in operation 460. The extracted sign of the spectrum and the extracted amplitude of the other spectrum are combined, thereby reconstructing the spectrum of the current frame in operation 470.

Alternatively, for every SFB, one of the SFB of the PGF and the SFB of the NGF may be selected at random and the amplitude of the spectrum of the selected SFB and the sign of the spectrum of the other SFB may be combined in order to reconstruct the spectrum of the current frame.

Figure 5A:
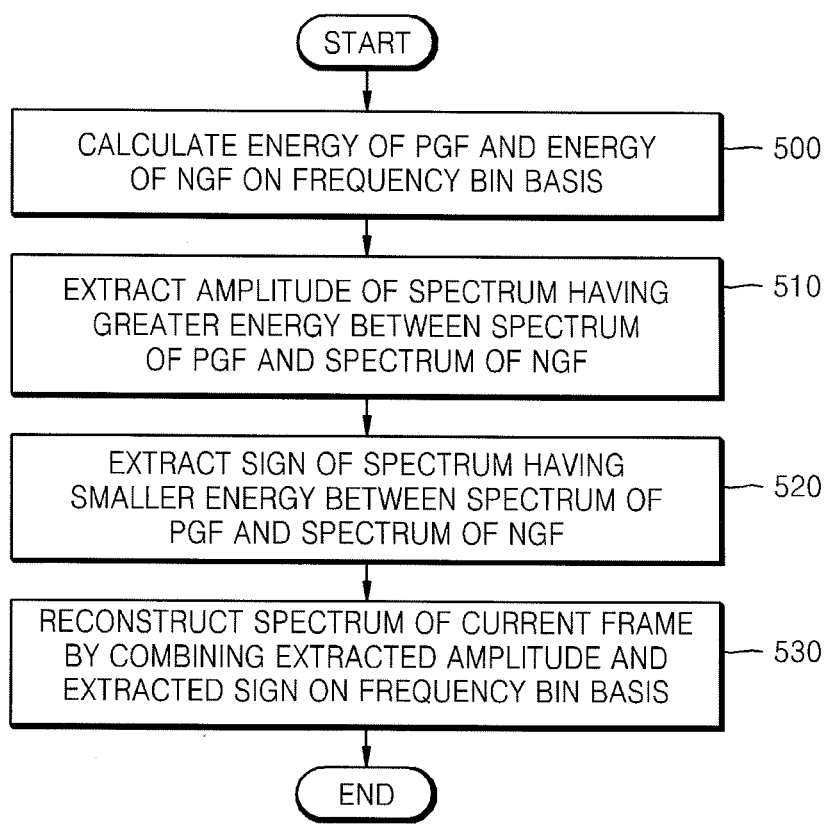

According to an exemplary embodiment of the present general inventive concept illustrated in FIG. 5A, for every frequency bin, the amplitude of the spectrum of one of the PGF and the NGF, which has the greater energy than the spectrum of the other, and the sign of the spectrum of the other are combined, thereby reconstructing the spectrum of the current frame. More specifically, for every frequency bin, the energy of the spectrum of the PGF and the energy of the spectrum of the NGF are calculated in operation 500. The amplitude of the spectrum having the greater energy between the energy of the spectrum of the PGF and the energy of the spectrum of the NGF is extracted in operation 510 and the sign of the spectrum having the smaller energy is extracted in operation 520. The extracted amplitude of the spectrum and the extracted sign of the other spectrum are combined, thereby reconstructing the spectrum of the current frame in operation 530.

Figure 5B:
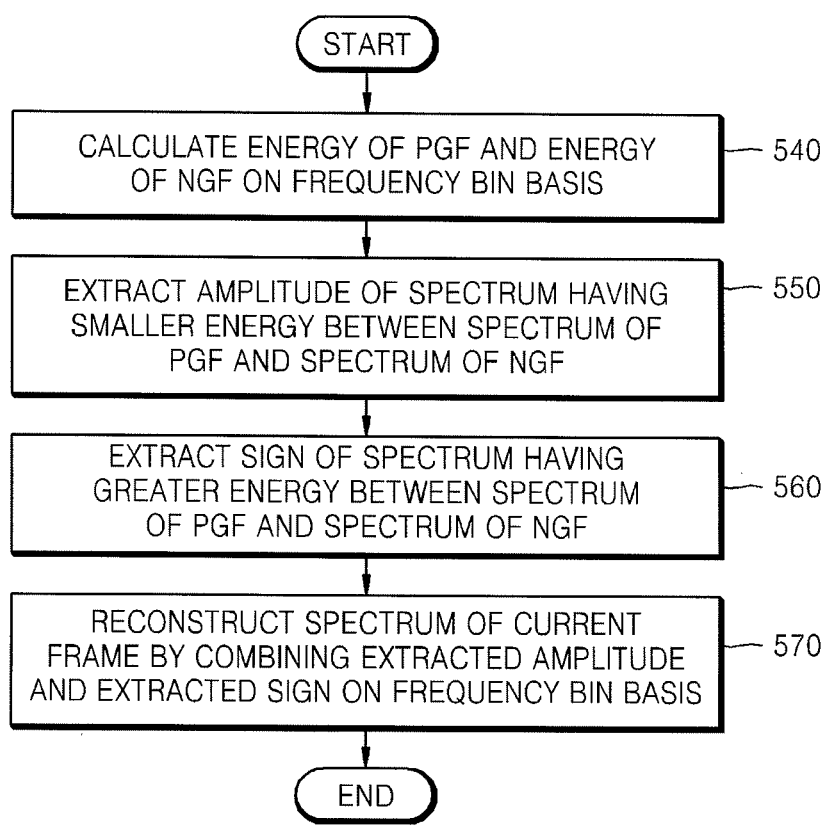

According to an exemplary embodiment of the present general inventive concept illustrated in FIG. 5B, for every frequency bin, the sign of the spectrum of one of the PGF and the NGF, which has the greater energy than the spectrum of the other, and the amplitude of the spectrum of the other are combined, thereby reconstructing the spectrum of the current frame. More specifically, for every frequency bin, the energy of the spectrum of the PGF and the energy of the spectrum of the NGF are calculated in operation 540. The sign of the spectrum having the greater energy between the energy of the spectrum of the PGF and the energy of the spectrum of the NGF is extracted in operation 550 and the amplitude of the spectrum having the smaller energy is extracted in operation 560. The extracted sign of the spectrum and the extracted amplitude of the other spectrum are combined, thereby reconstructing the spectrum of the current frame in operation 570.

Alternatively, for every frequency bin, one of the spectrum of the PGF and the spectrum of the NGF may be selected at random and the amplitude of the selected spectrum and the sign of the other spectrum may be combined in order to reconstruct the spectrum of the current frame.

In the exemplary embodiments illustrated in FIGS. 3A through 5B, the spectrum of the current frame is reconstructed by combining the amplitude of the spectrum of one of the PGF and the NGF and the sign of the spectrum of the other, i.e., using spectrum composition. However, in the following exemplary embodiments illustrated in FIGS. 6A through 8B, the spectrum of the current frame is reconstructed by referring to both the amplitude and the sign of the spectrum of one of the PGF and the NGF, i.e., using spectrum merging.

Figure 6A:
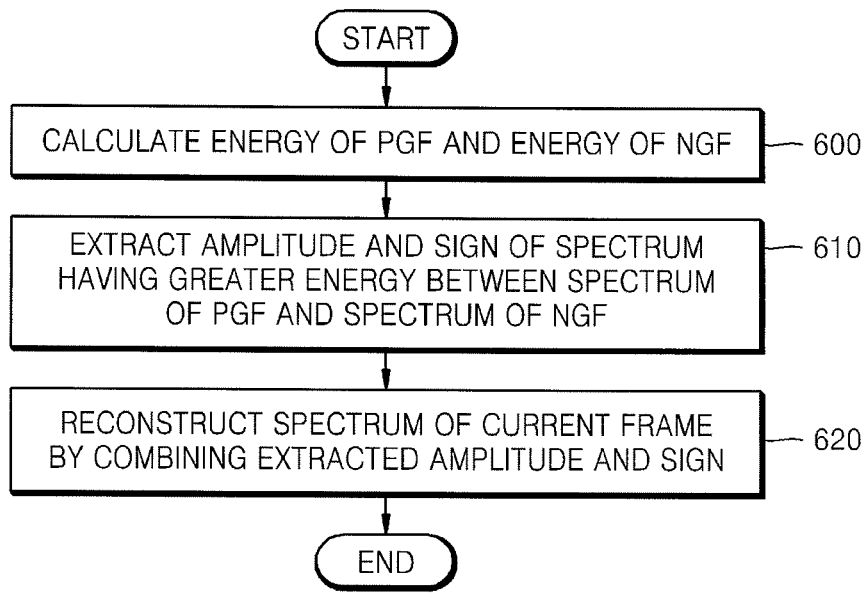

According to an exemplary embodiment of the present general inventive concept illustrated in FIG. 6A, the spectrum of the current frame is reconstructed using the spectrum of one of the PGF and the NGF, which has the greater energy than the other frame. More specifically, the energy of the PGF and the energy of the NGF are calculated in operation 600. The amplitude and sign of the spectrum of one of the PGF and the NGF, which has the greater energy than the other frame, are extracted in operation 610. In operation 620, the spectrum of the current frame is reconstructed using the extracted amplitude and sign.

Figure 6B:
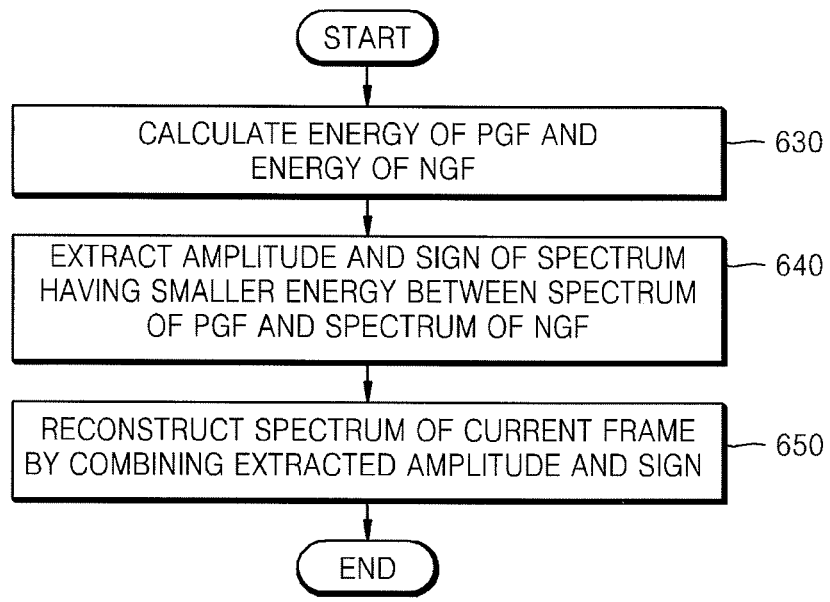

According to an exemplary embodiment of the present general inventive concept illustrated in FIG. 6B, the spectrum of the current frame is reconstructed using the spectrum of one of the PGF and the NGF, which has the smaller energy than the other frame. More specifically, the energy of the PGF and the energy of the NGF are calculated in operation 630. The amplitude and sign of the spectrum of one of the PGF and the NGF, which has the smaller energy than the other frame, are extracted in operation 640. In operation 650, the spectrum of the current frame is reconstructed using the extracted amplitude and sign.

Figure 7A:
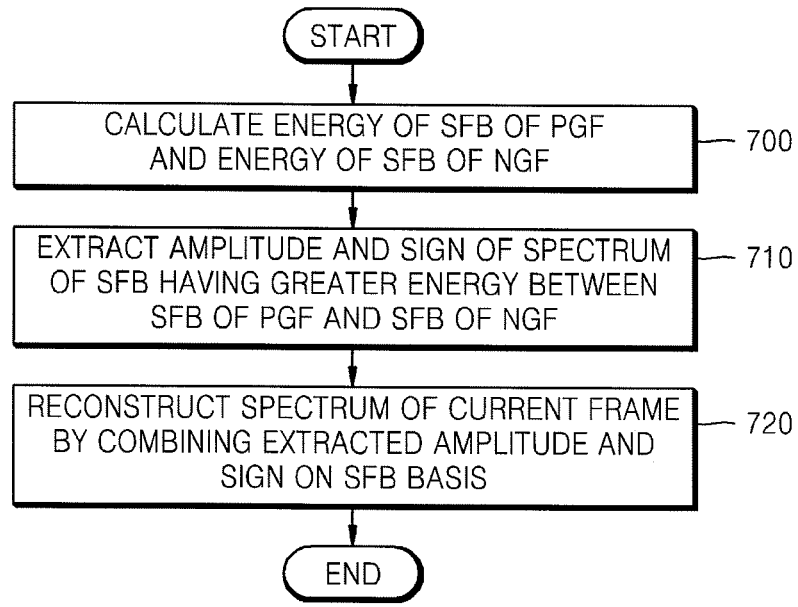

According to an exemplary embodiment of the present general inventive concept illustrated in FIG. 7A, for every SFB, the spectrum of the current frame is reconstructed using the amplitude and sign of the spectrum of the SFB of one of the PGF and the NGF, which has the greater energy than the SFB of the other. More specifically, for every SFB, the energy of the SFB of the PGF and the energy of the SFB of the NGF are calculated in operation 700. The amplitude and sign of the spectrum of the SFB having the greater energy between the energy of the SFB of the PGF and the energy of the SFB of the NGF are extracted in operation 710. The spectrum of the current frame is reconstructed using the extracted amplitude and sign in operation 720.

Figure 7B:
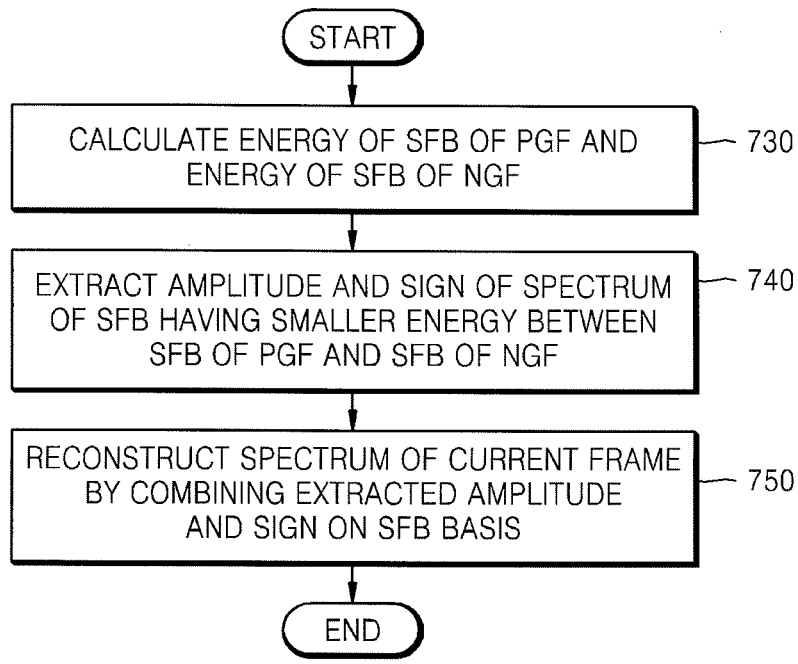

According to an exemplary embodiment of the present general inventive concept illustrated in FIG. 7B, for every SFB, the spectrum of the current frame is reconstructed using the amplitude and sign of the spectrum of the SFB of one of the PGF and the NGF, which has the smaller energy than the SFB of the other. More specifically, for every SFB, the energy of the SFB of the PGF and the energy of the SFB of the NGF are calculated in operation 730. The amplitude and sign of the spectrum of the SFB having the smaller energy between the energy of the SFB of the PGF and the energy of the SFB of the NGF are extracted in operation 740. The spectrum of the current frame is reconstructed using the extracted amplitude and sign in operation 750.

Figure 8A:
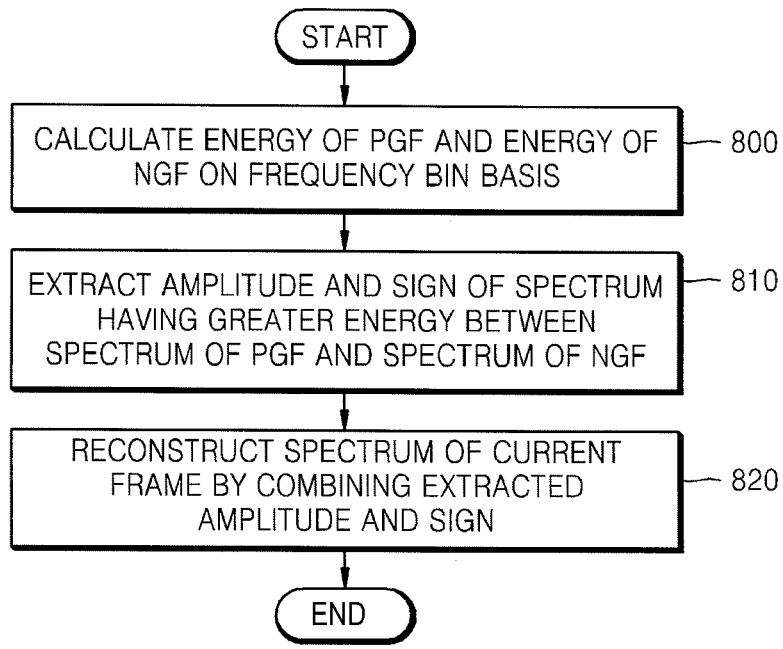

According to an exemplary embodiment of the present general inventive concept illustrated in FIG. 8A, for every frequency bin, the spectrum of the current frame is reconstructed using the amplitude and sign of the spectrum of one of the PGF and the NGF, which has the greater energy than the spectrum of the other. More specifically, for every frequency bin, the energy of the spectrum of the PGF and the energy of the spectrum of the NGF are calculated in operation 800. The amplitude and sign of the spectrum having the greater energy between the energy of the spectrum of the PGF and the energy of the spectrum of the NGF are extracted in operation 810. In operation 820, the spectrum of the current frame is reconstructed using the extracted amplitude and sign for every frequency bin.

Figure 8B:
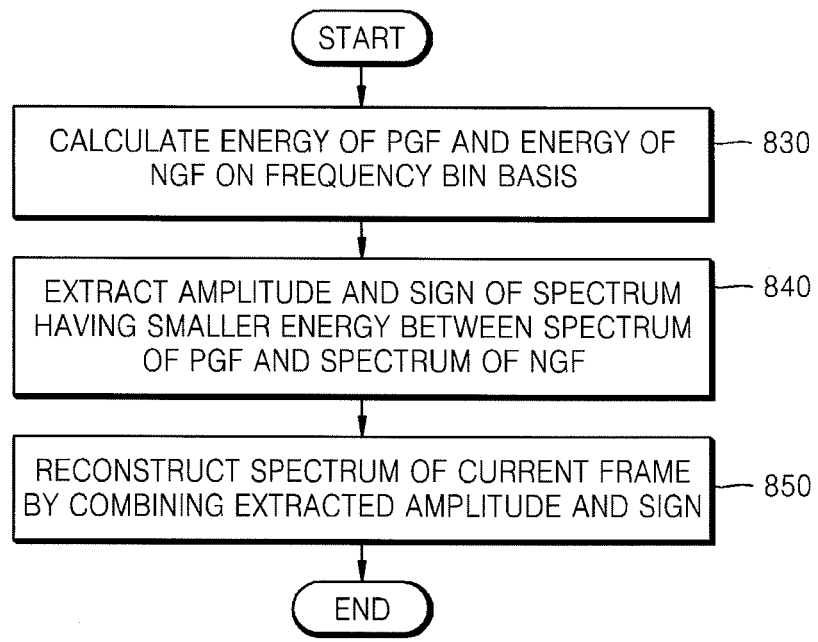

According to an exemplary embodiment of the present general inventive concept illustrated in FIG. 8B, for every frequency bin, the spectrum of the current frame is reconstructed using the amplitude and sign of the spectrum of one of the PGF and the NGF, which has the smaller energy than the spectrum of the other. More specifically, for every frequency bin, the energy of the spectrum of the PGF and the energy of the spectrum of the NGF are calculated in operation 830. The amplitude and sign of the spectrum having the smaller energy between the energy of the spectrum of the PGF and the energy of the spectrum of the NGF are extracted in operation 840. In operation 850, the spectrum of the current frame is reconstructed using the extracted amplitude and sign for every frequency bin.

Figure 9:
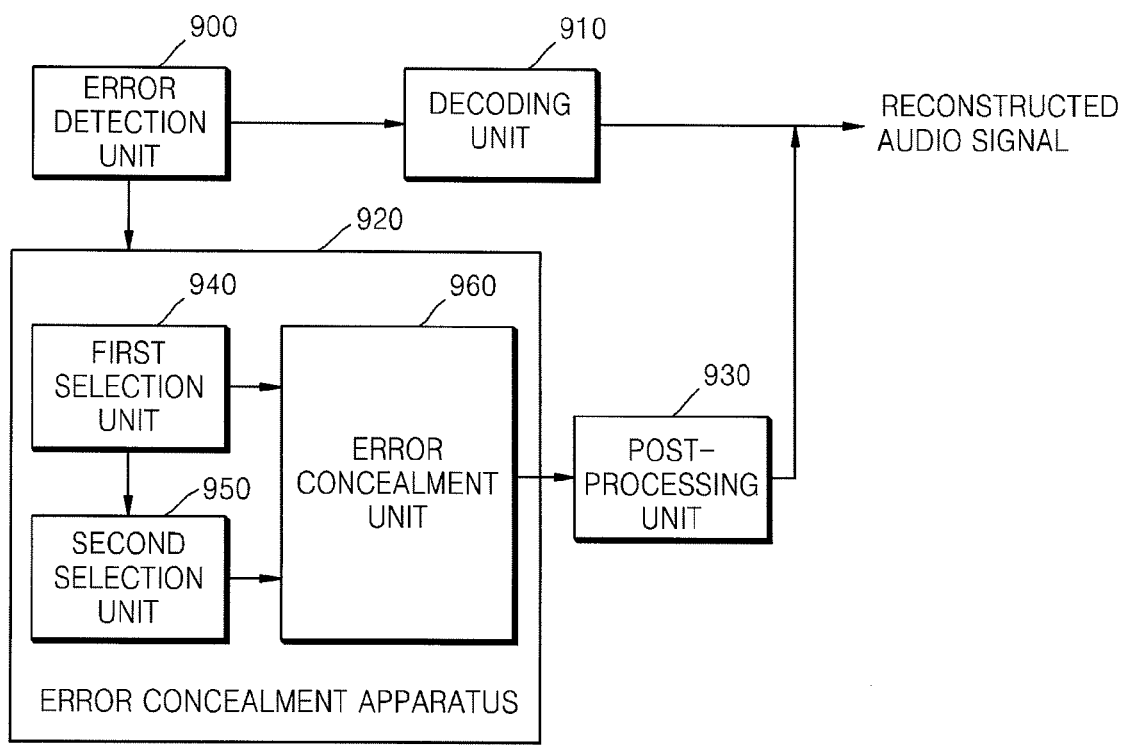
FIG. 9 is a block diagram illustrating a decoding apparatus for an audio signal including an error concealment apparatus for an audio signal according to an exemplary embodiment of the present general inventive concept.

FIG. 9 is a block diagram of a decoding apparatus for an audio signal including an error concealment apparatus 920 for an audio signal according to an exemplary embodiment of the present general inventive concept. The decoding apparatus includes an error detection unit 900, a decoding unit 910, the error concealment apparatus 920, and a post-processing unit 930. The error concealment apparatus 920 includes a first selection unit 940, a second selection unit 950, and an error concealment unit 960. Hereinafter, the operation of the error concealment apparatus 920 and the operation of the decoding apparatus including the error concealment apparatus 920 according to an exemplary embodiment of the present general inventive concept will be described with reference to FIG. 9.

The error detection unit 900 checks if an error occurs in the current frame. If an error occurs in the current frame, the error detection unit 900 checks if an error position at which the error occurs is before or after a predetermined threshold position. If the error does not occur in the current frame, i.e., the current frame is a good frame, or if the error occurs and the error position is after the threshold position, the error detection unit 900 transmits the current frame to the decoding unit 910. If the error occurs in the current frame and the error position is before the threshold position, the error detection unit 900 transmits the current frame to the error concealment apparatus 920. When a bitstream is composed of a plurality of layers like a bitstream encoded using bit sliced arithmetic coding (BSAC), layers preceding the error position can be decoded normally. Thus, when an error occurs in the last layer, which hardly has an influence upon the sound quality of the audio signal, layers preceding the last layer where the error occurs are reconstructed normally and spectrum information of the last layer can be reconstructed from spectrum information of the reconstructed layers. Thus, although the determination made by the error detection unit 900 that the error occurs in the current frame, when the error position is after the threshold position, and thus the error hardly has an influence upon the sound quality of an audio signal, the error of the current frame is not concealed. Also, the current frame is decoded normally, instead of reconstructing the current frame having the error using error concealment, thereby making the most of information in layers where the error does not exist.

The decoding unit 910 normally decodes the current frame transmitted from the error detection unit 900 and the error concealment apparatus 920 conceals the error of the current frame transmitted from the error detection unit 900. A decoding result for a good frame may be stored to be used in error concealment for a next frame.

The first selection unit 940 determines whether the error of the current frame can be concealed in the frequency domain, i.e., error concealment in the frequency domain is applicable to conceal the error of the current frame, based on error occurrence conditions and window types of a previous frame preceding the current frame and a next frame following the current frame. Detailed criteria for the determination performed by the first selection unit 940 will be described below.

When the first selection unit 940 determines that the error of the current frame can be concealed in the frequency domain, the first selection unit 940 further determines whether to conceal the error in the frequency domain or in the time domain based on the length of a frame interval including the error. More specifically, when the length of the frame interval including the error exceeds a predetermined threshold length, the first selection unit 940 determines to conceal the error in the time domain. When the length of the frame interval including the error does not exceed the threshold length, the first selection unit 940 determines to conceal the error in the frequency domain. This is because, although the error occurring over a long interval is concealed using the interpolation scheme, the length of an error-concealed interval during which the error is concealed increases due to the repetition scheme and thus the same spectrum is repeated over the long interval, causing modulation noise. Accordingly, when the error occurs over a long interval, error concealment in the time domain is performed even if error concealment in the frequency domain is available, thereby minimizing modulation noise and sound quality degradation.

The first selection unit 940 determines that the error of the current frame can be concealed in the frequency domain and determines to conceal the error of the current frame in the frequency domain based on the length of a frame interval including the error. The second selection unit 950 determines whether to conceal the error of the current frame using the repetition scheme in the frequency domain or the interpolation scheme in the frequency domain based on the error occurrence conditions and window types of the previous frame and the next frame. As mentioned above, when the length of the error-concealed interval using the repetition scheme increases, modulation noise may be generated. Thus, it may be desirable to use the interpolation scheme when the interpolation scheme is applicable and use the repetition scheme only when the interpolation scheme is not applicable based on error occurrence conditions and window types of the previous frame and the next frame. Criteria for the determination performed by the second selection unit 950 will be described below.

When the first selection unit 940 determines that the error of the current frame can be concealed in the frequency domain and the length of the frame interval including the error does not exceed the threshold length, the error concealment unit 960 conceals the error of the current frame using the interpolation scheme or the repetition scheme. Thus, the error concealment unit 960 reconstructs the spectrum of the current frame using the spectrum of the PGF and/or the spectrum of the NGF and performs an inverse MDCT on the reconstructed spectrum, thereby reconstructing the audio signal of the current frame.

When the first selection unit 940 determines that the error of the current frame cannot be concealed in the frequency domain or the length of the frame interval including the error exceeds the threshold length even if the error of the current frame can be concealed in the frequency domain, the error concealment unit 960 conceals the error of the current frame in the time domain. In the time domain, the error concealment unit 960 reconstructs the audio signal of the current frame sing a time-domain audio signal of the PGF and/or a time-domain audio signal of the NGF.

The post-processing unit 930 performs fade-in and fade-out operations in the time domain on the audio signal of the current frame, which has been reconstructed by the error concealment apparatus 920, in order to allow the reconstructed audio signal to be heard naturally.

Hereinafter, the criteria for the determination performed by the first selection unit 940 of whether error concealment in the frequency domain is applicable and the criteria for the determination performed by the second selection unit 950 of whether the interpolation scheme in the frequency domain is applicable will be described in detail. According to an embodiment of the present general inventive concept, the first selection unit 940 selects one of error concealment in the frequency domain and error concealment in the time domain to conceal the error of the current frame based on the error occurrence conditions and window types of the previous frame and the next frame. Also, the second selection unit 950 selects one of the repetition scheme and the interpolation scheme in the frequency domain to conceal the error of the current frame based on the error occurrence conditions and window types of the previous frame and the next frame.

Accordingly, the error occurrence condition of a frame indicates whether or not an error occurs in the frame. Thus, a frame where an error occurs is marked with E (error) and a frame where an error does not occur is marked with G (good). The window type of a frame indicates whether the window of the frame is a long window or a short window. Thus, a frame having a long window is marked with L (long) and a frame having a short window is marked with S (short). Although the window type may further include a long stop window that is inserted when a change from the long window to the short window and a long start window that is inserted when a change from the short window to the long window, the other windows except for the long window will be referred to as short windows for convenience of explanation. In general, the long window is used for modulated discrete cosine transformation (MDCT) with respect to a stationary signal that hardly changes during a long interval and is stable and the short window is used for MDCT with respect to a transient signal that sharply changes or includes a sudden attack signal.

The following principles are used as the criteria for the determination of an error concealment scheme for the current frame, which is performed by the first selection unit 940 and the second selection unit 950.

In order to apply error concealment in the frequency domain to the error of the current frame, at least one of the previous frame and the next frame has to be a good frame. This is because the interpolation scheme reconstructs the spectrum of the current frame by interpolating the spectrum of the PGF and the spectrum of the NGF and the repetition scheme reconstructs the spectrum of the current frame by copying the spectrum of one of the PGF and the NGF.

The window type of a good frame used in error concealment in the frequency domain has to be a long window. This is because, in the interpolation scheme, when the window type of the PGF and the window type of the NGF are different from each other, spectrum coefficients in the frequency domain cannot be interpolated, due to the nature of MDCT. Also in the repetition scheme, when the window type of a good frame to be copied to the current frame is not a long window, the audio signal of the current frame, which is reconstructed by copying the spectrum of the good frame to the current frame, may cause unexpected noise. For example, for the PGF undergoing MDCT using 8 short windows, when the spectrum of the current frame is reconstructed by repeating spectrum data corresponding to the last window of the PGF 8 times and the last window includes an attack signal or a noise signal, the attack signal or the noise signal may be repetitively output from the current frame. Moreover, since the spectrum data corresponding to the last window is repeated 8 times, modulation noise may be generated.

When the previous frame is an error frame and the error of the previous frame is concealed in the time domain, the spectrum of the previous frame is not supposed to be reconstructed. Accordingly, since the reconstructed spectrum of the previous frame cannot be used to conceal the error of the current frame, the current frame may be reconstructed using a next frame when the next frame is a good frame, or the error of the current frame may be concealed in the time domain using a reconstructed time domain signal of the previous frame. Thus, the repetition scheme that uses the spectrum of the previous frame cannot be used to conceal the error of the current frame.

Hereinafter, error concealment schemes to control the error of the current frame, which are determined based on the error occurrence conditions and window types of the previous frame and the next frame, according to an exemplary embodiment of the present general inventive concept, will be described with reference to FIG. 2. FIG. 2 illustrates a table illustrating error concealment schemes for the current frame according to the error occurrence conditions and window types of the previous frame and the next frame according to the present inventive concept.

Where both the previous frame and the next frame are good frames will be considered. When the window types of the PGF and the NGF are long widows, the interpolation scheme in the frequency domain can be applied and thus the error of the current frame is concealed using the interpolation scheme. When the window type of only one of the PGF and the NGF is a long window, the error of the current frame is concealed by repeating the spectrum of a frame that is MDCT-transformed using a long window in the current frame. When the window type of neither the PGF nor the NGF is a long window, the error of the current frame is concealed using error concealment in the time domain. Accordingly, error concealment in the frequency domain, such as the interpolation scheme or the repetition scheme, cannot be used as discussed above. Instead, it may be desirable to reconstruct a time-domain signal of the current frame using both a time-domain signal of the PGF and a time-domain signal of the NGF.

Where only one of the previous frame and the next frame is a good frame and the other is an error frame will be considered. Further, whether or not the window type of the good frame is a long window will be considered. When the window type of the PGF or the NGF is a long window, the error of the current frame is concealed according to the repetition scheme using the good frame having the long window. Accordingly, when the previous frame is an error frame and the window type of the NGF is a long window, the error of the current frame may be concealed according to the repetition scheme using the NGF. However, if the error of the previous frame has not been concealed in the time domain, i.e., the error of the previous frame has been concealed using the repetition scheme, the spectrum of the current frame may be reconstructed by interpolating the reconstructed spectrum of the previous frame and the spectrum of the NGF, thereby concealing the error of the current frame. When the window type of the PGF or the NGF is not a long window, the repetition scheme cannot be used and thus the error of the current frame is concealed using error concealment in the time domain. Accordingly, an error concealment scheme for the current frame is determined in a similar manner where the window type of only one of the PGF and the NGF is a long window or where the window type of neither the PGF nor the NGF is a long window.

Where both the previous frame and the next frame are error frames will be considered. An error concealment scheme that can be applied to the error of the current frame is determined according to an error concealment scheme used to conceal the error of the previous frame. Where the error of the previous frame is concealed using the repetition scheme in the frequency domain will be discussed. Since the current frame is an error frame, the interpolation scheme may not be used in the previous frame. When the error of the previous frame is concealed using the repetition scheme, the error of the current frame may also be concealed by repeating a spectrum that has been repeated for the previous frame. However, when modulation noise is likely to be generated because a frame error has been concealed using the repetition scheme over a consecutive number of times, the error concealment scheme may be changed to conceal the frame error using the time domain. Alternatively, where the error of the previous frame is concealed in the time domain will be discussed. Since, the error of the previous frame is concealed in the time domain, there is no reconstructed spectrum of the previous frame. Accordingly, the spectrum of the previous frame cannot be used to conceal the error of the current frame using the repetition scheme. Thus, when the error of the previous frame is concealed using error concealment in the time domain, the error of the current frame may also be concealed using error concealment in the time domain.

Thus, the first selection unit 940 determines whether error concealment in the frequency domain, i.e., the repetition scheme or the interpolation scheme, is applicable to conceal the error of the current frame. Accordingly, the first selection unit 930 determines that error concealment in the frequency domain can be applied to conceal the error of the current frame (1) where at least one of the previous frame and the next frame is a good frame and at least one of the window types of good frames is a long window or (2) where neither the previous frame nor the next frame are good frames, i.e., both the previous frame and the next frame are error frames, and error concealment in the frequency domain, i.e., the repetition scheme, is applied to conceal the error of the previous frame. Otherwise, the first selection unit 940 determines that error concealment in the frequency domain cannot be applied and thus the error of the current frame is concealed using error concealment in the time domain.

Also, the second selection unit 950 determines whether to use the interpolation scheme in the frequency domain or the repetition scheme in the frequency domain to conceal the error of the current frame. Accordingly, the second selection unit 950 determines to use the interpolation scheme to conceal the error of the frame (1) where both the previous frame and the next frame are good frames and the window types of both the previous frame and the next frame are long windows or (2) where the error of the previous frame has been concealed using the repetition scheme, the next frame is a good frame, and the window type of the next frame is a long window. The second selection unit 950 determines to use the repetition scheme to conceal the error of the current frame such as (3) where both the previous frame and the next frame are good frames, but the window type of only one of the previous frame and the next frame is a long window, (4) where only one of the previous frame and the next frame is a good frame and the window type of the good frame is a long window, or (5) where both the previous frame and the next frame are error frames and the error of the previous frame is concealed using the repetition scheme.

As discussed above, however, when the previous frame is an error frame, the next frame is a good frame, and the window type of the next frame is a long window, if the error of the previous frame has been concealed using the repetition scheme, the error of the current frame can be concealed by interpolating the reconstructed spectrum of the previous frame and the spectrum of the next good frame or by repeating the spectrum of the next good frame. Thus, one of the interpolation scheme and the repetition scheme may be determined as an error concealment scheme for the current frame.

Thus, according to an embodiment of the present general inventive concept, the optimal error concealment scheme for the current frame can be selected from among the repetition scheme and the interpolation scheme in the frequency domain and error concealment in the time domain based on the error occurrence conditions and window types of the previous frame and the next frame. Also, the error of the current frame can be concealed using the selected scheme, thereby minimizing modulation noise and sound quality degradation in the reconstructed audio signal.

Meanwhile, the present general inventive concept can also be embodied as computer-readable code on a computer-readable medium. The computer-readable medium is any data storage device that can store data that can be thereafter read by a computer system. Examples of the computer-readable medium include read-only memory (ROM), random-access memory (RAM), CD-ROMs, magnetic tapes, floppy disks, and optical data storage devices and carrier waves (such as data transmission through the Internet). The computer readable medium can also be distributed over network-coupled computer systems so that the computer-readable code is stored and executed in a distributed fashion. Also, functional programs, codes and code segment to accomplish the present general inventive concept can be easily construed by programmers skilled in the art to which the present general inventive concept pertains.

As described above, in the error concealment method and apparatus for an audio signal according to the present general inventive concept, a repetition scheme and an interpolation scheme in a frequency domain are selectively utilized to conceal an error that occurs in a frame. Also, error concealment in a time domain is used when it is difficult or impossible to conceal the error in the frequency domain, thereby preventing sound quality from degrading due to modulation noise.

Furthermore, in the decoding method and apparatus for an audio signal according to the present general inventive concept, sound quality can be prevented from degrading due to modulation noise by reconstructing an error frame using the error concealment method and apparatus, thereby improving perceptual sound quality.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of concealing an error in an audio or speech signal, the method comprising:
   determining, performed by using at least one processor, an error concealment scheme of a frame from a plurality of error concealment schemes, based on at least signal characteristics including stationarity of the audio or speech signal and an error concealment scheme used for a previous frame, when the frame corresponds to a current error frame or a next good frame after an error frame; and
   concealing the frame based on the determined error concealment scheme.

2. The method of claim 1, wherein the signal characteristics are obtained by using a length of the frame.

3. The method of claim 1, wherein the signal characteristics are obtained by using a window type of the previous frame.

4. A method for decoding an audio or speech signal, the method comprising:
   decoding a frame when an error does not occur in the frame and the frame does not correspond to a next good frame after an error frame; and
   determining, performed by using at least one processor, an error concealment scheme of the frame from a plurality of error concealment schemes, based on signal characteristics including stationarity of the audio or speech signal and an error concealment scheme used for a previous frame, when the frame corresponds to a current error frame or the next good frame after the error frame; and
   concealing the frame based on the determined error concealment scheme.

5. The method of claim 4, wherein the signal characteristics are obtained by using a length of the frame.

6. The method of claim 4, wherein the signal characteristics are obtained by using a window type of the previous frame.

7. The method of claim 1, wherein the plurality of error concealment schemes comprises a repetition based concealment scheme.

8. The method of claim 4, wherein the plurality of error concealment schemes comprises a repetition based concealment scheme.

9. A computer program product embodied in a non-transitory computer readable storage medium for concealing an error in an audio or speech signal, the computer program product comprising the programming instructions for:
   determining an error concealment scheme of a frame from a plurality of error concealment schemes, based on at least signal characteristics including stationarity of the audio or speech signal and an error concealment scheme used for a previous frame, when the frame corresponds to a current error frame or a next good frame after an error frame; and
   concealing the frame based on the determined error concealment scheme.

10. A computer program product of claim 9, wherein the plurality of error concealment schemes comprises a repetition based concealment scheme.

* * * * *